(12) United States Patent
Choi

(10) Patent No.: US 11,302,408 B2
(45) Date of Patent: Apr. 12, 2022

(54) MEMORY DEVICE

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/951,160

(22) Filed: Nov. 18, 2020

(65) Prior Publication Data

US 2022/0044745 A1 Feb. 10, 2022

(30) Foreign Application Priority Data

Aug. 6, 2020 (KR) .......................... 10-2020-0098794

(51) Int. Cl.
*G11C 11/34* (2006.01)
*G11C 16/34* (2006.01)
*G11C 16/10* (2006.01)
*G11C 16/32* (2006.01)
*G11C 16/30* (2006.01)
*G11C 16/08* (2006.01)
*G11C 16/26* (2006.01)

(52) U.S. Cl.
CPC .......... *G11C 16/3459* (2013.01); *G11C 16/08* (2013.01); *G11C 16/10* (2013.01); *G11C 16/26* (2013.01); *G11C 16/30* (2013.01); *G11C 16/32* (2013.01)

(58) Field of Classification Search
CPC ............ G11C 16/3454; G11C 16/3459; G11C 16/5628; G11C 16/0483; G11C 221/5621

USPC .......................... 365/185.22, 185.18, 189.05
See application file for complete search history.

(56) References Cited

U.S. PATENT DOCUMENTS 10,535,405 B2 * 1/2020 Lee .......................... G11C 16/30

FOREIGN PATENT DOCUMENTS

KR 10-2018-0046067 5/2018
KR 10-1938659 1/2019

* cited by examiner

*Primary Examiner* — Son T Dinh
(74) *Attorney, Agent, or Firm* — IP & T Group LLP

(57) ABSTRACT

The present technology includes memory device and a method of operating the same. The memory device includes a current sensing circuit configured to perform an individual current sensing operation according to a verify result of each of selected program states in an individual current sensing mode and perform an entire current sensing operation according to a verify result of the entire memory cells regardless of the selected program states after the individual current sensing operation is performed in a mixed current sensing mode, and a voltage generator configured to apply a program voltage to a selected word line connected to the memory cells during a first amount of time in the individual current sensing mode and apply the program voltage to the selected word line during a second amount of time greater than the first amount of time in the mixed current sensing mode, in response to the operation code.

20 Claims, 12 Drawing Sheets

MEMORY DEVICE

CROSS-REFERENCE TO RELATED APPLICATION

The present application claims priority under 35 U.S.C. § 119(a) to Korean patent application number 10-2020-0098794, filed on Aug. 6, 2020, which is incorporated herein by reference in its entirety.

BACKGROUND

Field of Invention

The present disclosure relates to a memory device, and more particularly, to a memory device capable of performing a program operation.

Description of Related Art

A memory device may include a volatile memory device in which stored data is lost when power supply is cut off, and a non-volatile memory device in which stored data is maintained even though the power supply is cut off.

The volatile memory device may include a dynamic random-access memory (DRAM) and a static random-access memory (SRAM). The non-volatile memory device may include a read only memory (ROM), a programmable read only memory (PROM), an erasable PROM (EPROM), an electrically EPROM (EEPROM), a NAND FLASH, and the like.

The memory device may include a memory cell array, a group of circuits collectively referred to as a peripheral circuit, and a logic circuit.

The memory cell array may include a plurality of memory cells that store data. The memory cell array may be configured of any of various types of memory cells in terms of storage capacity. A single level cell (SLC) is capable of storing one bit of data and a multi-level cell (MLC) is capable of storing two bits of data. A triple level cell (TLC) is capable of storing three bits of data, and a quadruple level cell (QLC) is capable of storing four bits of data.

SUMMARY

An embodiment of the present disclosure provides a memory device capable of preventing an increase of a program operation time due to a current sensing operation for checking a result of a program operation.

A memory device according to an embodiment of the present disclosure includes a plurality of memory cells, page buffers configured to store sensing data sensed from the memory cells, a current sensing circuit configured to perform an individual current sensing operation of outputting a pass signal or a fail signal according to a verify result of each of selected program states in an individual current sensing mode and perform an entire current sensing operation of outputting the pass signal or the fail signal according to a verify result of the entire memory cells regardless of the selected program states after the individual current sensing operation is performed in a mixed current sensing mode, in response to a sensing mode signal, a sensing mode selector configured to output the sensing mode signal corresponding to the individual current sensing mode or the mixed current sensing mode in response to the pass signal or the fail signal, and output an operation code according to the sensing mode signal, and a voltage generator configured to apply a program voltage to a selected word line connected to the memory cells during a first amount of time in the individual current sensing mode and apply the program voltage to the selected word line during a second amount of time greater than the first amount of time in the mixed current sensing mode, in response to the operation code.

A memory device according to an embodiment of the present disclosure includes a plurality of memory cells, page buffers configured to store sensing data sensed from the memory cells, a current sensing circuit configured to perform an individual current sensing operation of outputting a pass signal or a fail signal according to a verify result of each of selected program states in an individual current sensing mode and perform an entire current sensing operation of outputting the pass signal or the fail signal according to a verify result of the entire memory cells regardless of the selected program states after the individual current sensing operation is performed in a mixed current sensing mode, in response to a sensing mode signal, a sensing mode selector configured to output the sensing mode signal corresponding to the individual current sensing mode or the mixed current sensing mode in response to the pass signal or the fail signal, and output an operation code according to the sensing mode signal, and a voltage generator configured to discharge a selected word line during a first duration of time in the individual current sensing mode and discharge the selected word line during a second duration of time greater than the first duration of time in the mixed current sensing mode, in response to the operation code, after applying a program voltage to the selected word line connected to the memory cells, during a program operation.

A memory device according to an embodiment of the present disclosure includes a plurality of memory cells, page buffers configured to store sensing data sensed from the memory cells, a current sensing circuit configured to perform an individual current sensing operation of outputting a pass signal or a fail signal according to a verify result of each of selected program states in an individual current sensing mode and perform an entire current sensing operation of outputting the pass signal or the fail signal according to a verify result of the entire memory cells regardless of the selected program states after the individual current sensing operation is performed in a mixed current sensing mode, in response to a sensing mode signal, a sensing mode selector configured to output the sensing mode signal corresponding to the individual current sensing mode or the mixed current sensing mode in response to the pass signal or the fail signal, and output an operation code according to the sensing mode signal, and a voltage generator configured to apply a compensation voltage to a discharged selected word line during a first duration of time in the individual current sensing mode and apply the compensation voltage to the discharged selected word line during a second duration of time greater than the first duration of time in the mixed current sensing mode, in response to the operation code, after applying a program voltage to the selected word line connected to the memory cells and discharging the selected word line, during a program operation.

A memory device according to an embodiment of the present disclosure includes a memory cell array, and a control circuit configured to perform, on the memory cell array, a sub program operation and a verify operation while sequentially performing an individual current sensing operation and an entire current sensing operation, wherein the control circuit completes the verify operation and the entire current sensing operation substantially at the same time by adjusting one or more periods of subordinate operations within the sub program operation.

The present technology may prevent an increase of a program operation time.

DETAILED DESCRIPTION

Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiment(s).

Figure 1:
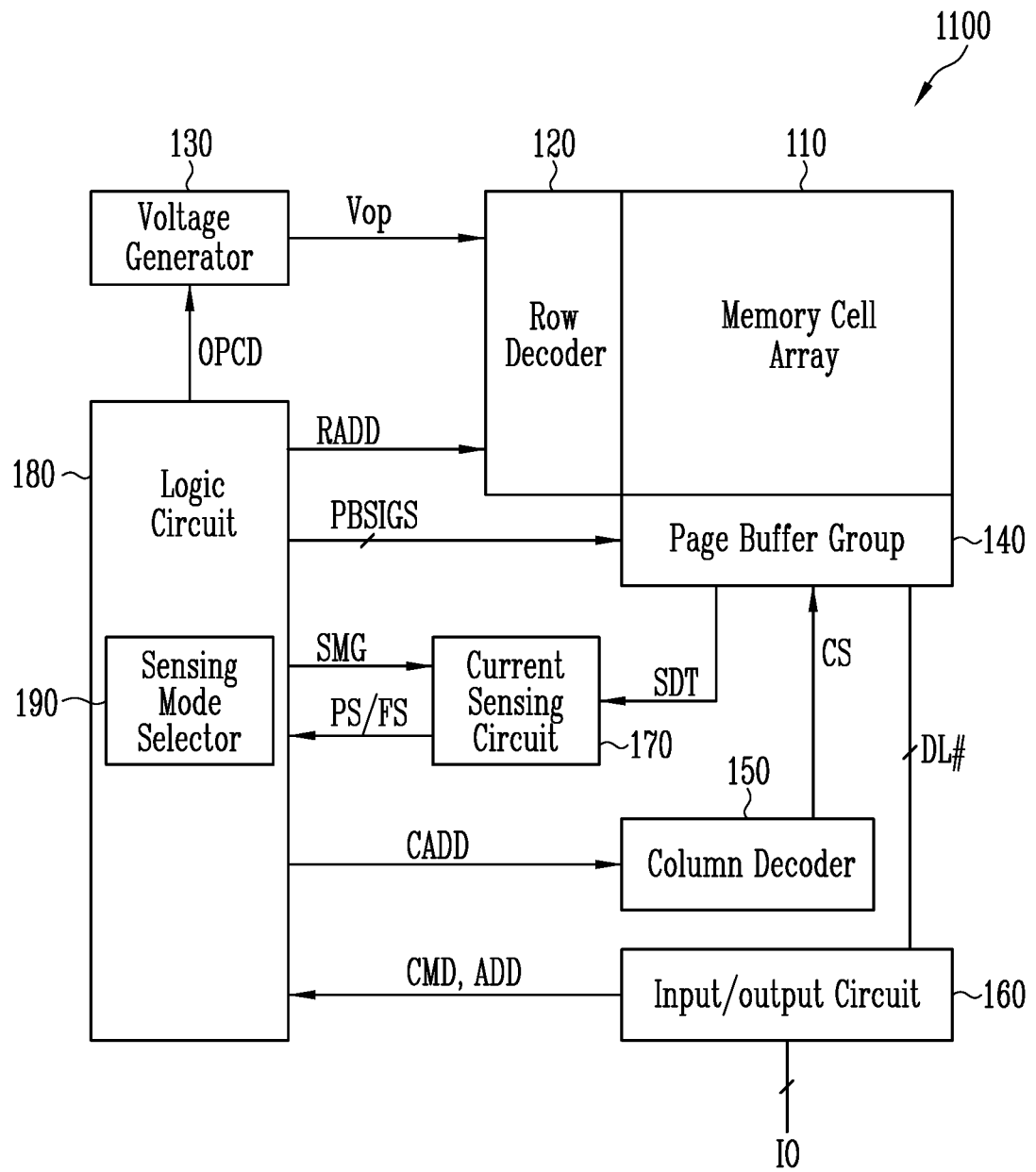
FIG. 1 is a diagram illustrating a memory device according to an embodiment of the present disclosure.

FIG. 1 is a diagram illustrating a memory device 1100 according to an embodiment of the present disclosure.

Referring to FIG. 1, the memory device 1100 may include a memory cell array 110, a row decoder 120, a voltage generator 130, a page buffer group 140, a column decoder 150, an input/output circuit 160, a current sensing circuit 170, and a logic circuit 180.

The memory cell array 110 may include a plurality of planes, and each of the planes may include a plurality of memory blocks in which data is stored. Each of the memory blocks may include a plurality of memory cells, and the memory cells may be implemented in a two-dimensional structure arranged parallel to a substrate or a three-dimensional structure stacked in a direction vertical to the substrate.

The row decoder 120 may select one of the memory blocks in the memory cell array 110 in response to a row address RADD and transmit operation voltages Vop to the selected memory block.

The voltage generator 130 may generate and output the operation voltages Vop for various operations in response to an operation code OPCD. For example, the voltage generator 130 may generate and output a program voltage, a verify voltage, a read voltage, an erase voltage, a pass voltage, and the like. The voltage generator 130 according to an embodiment may adjust voltages applied to word lines according to a current sensing mode. For example, the voltage generator 130 may be configured to adjust an amount of time in which the program voltage is applied, an amount of time for discharging the word lines, and an amount of time for compensating for a word line voltage.

The page buffer group 140 may be connected to the memory cell array 110 through bit lines. For example, the page buffer group 140 may include page buffers respectively connected to the bit lines. The page buffers may operate simultaneously in response to page buffer control signals PBSIG, and may temporarily store data during a program or read operation. Each of the page buffers may include a plurality of latches capable of storing data. Sensing data SDT sensed during a verify operation may be stored in one of the plurality of latches included in the page buffer. During the verify operation, the plurality of page buffers may store the sensing data SDT transmitted from the bit lines. During a current sensing operation, the plurality of page buffers may transmit the sensing data SDT to the current sensing circuit 170.

The column decoder 150 may output a column select signal CS in response to a column address CADD, and the plurality of page buffers included in the page buffer group 140 may store data loaded on data lines DL# in response to the column select signal CS.

The input/output circuit 160 may connect the memory device 1100 and an external device to each other through input/output lines IO. Here, the external device may be a controller capable of controlling the memory device 1100. The input/output circuit 160 may receive a command CMD, an address ADD, and data through the input/output lines IO or output data to an external device, and may receive data from the page buffer group 140 through the data lines DL #. The input/output circuit 160 may transmit the command CMD and the address ADD received through the input/output lines IO to the logic circuit 180 and may transmit data to the page buffer group 140.

The current sensing circuit 170 may perform a current sensing operation by receiving the sensing data SDT from the page buffer group 140. The current sensing operation determines whether memory cells are programmed to a target state, and may include an individual current sensing operation and an entire current sensing operation. The individual current sensing operation determines whether the memory cells are programmed to a selected program state, and the entire current sensing operation determines whether the program operation of a selected page is completed. For example, the individual current sensing operation may be performed to determine a program state among a plurality of program states, and the entire current sensing operation may be performed to determine the entire program state.

The current sensing circuit 170 may selectively perform the individual current sensing operation and the entire current sensing operation in response to a sensing mode signal SMG, and may perform the entire current sensing operation after performing the individual current sensing operation. For example, the sensing mode signal SMG may be output an individual current sensing mode signal, an entire current sensing mode signal, or a mixed current sensing mode signal. In the mixed current sensing mode the entire current sensing operation is performed sequentially after the individual current sensing operation is performed.

The current sensing circuit 170 may generate a reference current and a reference voltage in response to a set permission bit and may generate a verify current and a verify voltage according to the sensing data SDT. The current sensing circuit 170 may output a pass signal PS or a fail signal FS by comparing the reference voltage and the verify voltage with each other.

During the individual current sensing operation, when the number of memory cells of which the verify operation failed, among the memory cells to be programmed to the selected program state, is equal to or less than a set number, the current sensing circuit 170 may determine that the verify operation on the selected program state passed and may output the pass signal PS. When the number of memory cells of which the verify operation failed is greater than the set number, the current sensing circuit 170 may determine that the verify operation on the selected program state failed and may output the fail signal FS. Here, the selected program state means a target program state of the memory cells. For example, in a multi-level cell method in which 2 bits of data are stored in one memory cell, the memory cell may have one erase state or may be programmed to one of three program states. Alternatively, in a triple level cell method in which 3 bits of data are stored in one memory cell, the memory cell may have one erase state or may be programmed to any one of seven program states. In the individual current sensing mode, the current sensing circuit 170 may perform the current sensing operation on each of the program states of the memory cells.

In the individual current sensing mode, the current sensing circuit 170 may determine whether the verify operation performed on each of the above-described program states passed or failed, and may output the pass or fail signal PS or FS according to the result of that determination.

In the entire current sensing mode, when the number of memory cells determined to have failed, among all memory cells to be programmed, regardless of the selected program state is equal to or less than a set number, the current sensing circuit 170 may determine that the verify operation passed and may output the pass signal PS. That is, when the number of fail bits is greater than the set number, the current sensing circuit 170 may determine the verify operation failed and may output the fail signal FS. The set number of memory cells in the entire current sensing mode is different from such number in the individual current sensing mode. For example it may be determined whether the verify operation on all memory cells to be programmed among the memory cells in the selected page passed or failed in the entire current sensing mode, and it may be determined whether the verify operation on the memory cells to be programmed to the selected program state among the memory cells included in the selected page is passed or failed in the individual current sensing mode. Therefore, the set number used in the entire current sensing mode may be greater than the set number used in the individual current sensing mode.

In the mixed current sensing mode, the current sensing circuit 170 may perform the individual current sensing operation and then perform the entire current sensing operation. The set number used in the individual current sensing operation is different from the set number used in the entire current sensing mode. For example, the set number used in each individual current sensing operation and the entire current sensing operation may be set according to different set permission bits. Therefore, the current sensing circuit 170 may select the permission bit in response to the sensing mode signal SMG, and may use the set number according to the selected permission bit in the selected mode.

The logic circuit 180 may output the operation code OPCD, the row address RADD, the page buffer control signals PBSIG, and the column address CADD in response to the command CMD and the address ADD. For example, the logic circuit 180 may include software that performs an algorithm for various operations in response to the command CMD, and hardware configured to output various signals according to the address ADD and the algorithm.

During the program operation, the logic circuit 180 may output the sensing mode signal SMG in response to the pass signal PS or the fail signal FS. For example, the logic circuit 180 may include a sensing mode selector 190 configured to output the sensing mode signal SMG in response to the pass signal PS or the fail signal FS. The sensing mode selector 190 may count the number of program loops performed during the program operation in response to the fail signal FS to obtain an accumulated number, and output the sensing mode signal SMG according to the accumulated number of program loops. The sensing mode selector 190 may initialize the count of the number of program loops when the pass signal PS is input.

In addition, the logic circuit 180 may output the operation code OPCD to adjust a time interval at which the verify voltage applied to the selected word line is changed in each of the individual current sensing mode and the mixed current sensing mode.

Figure 2:
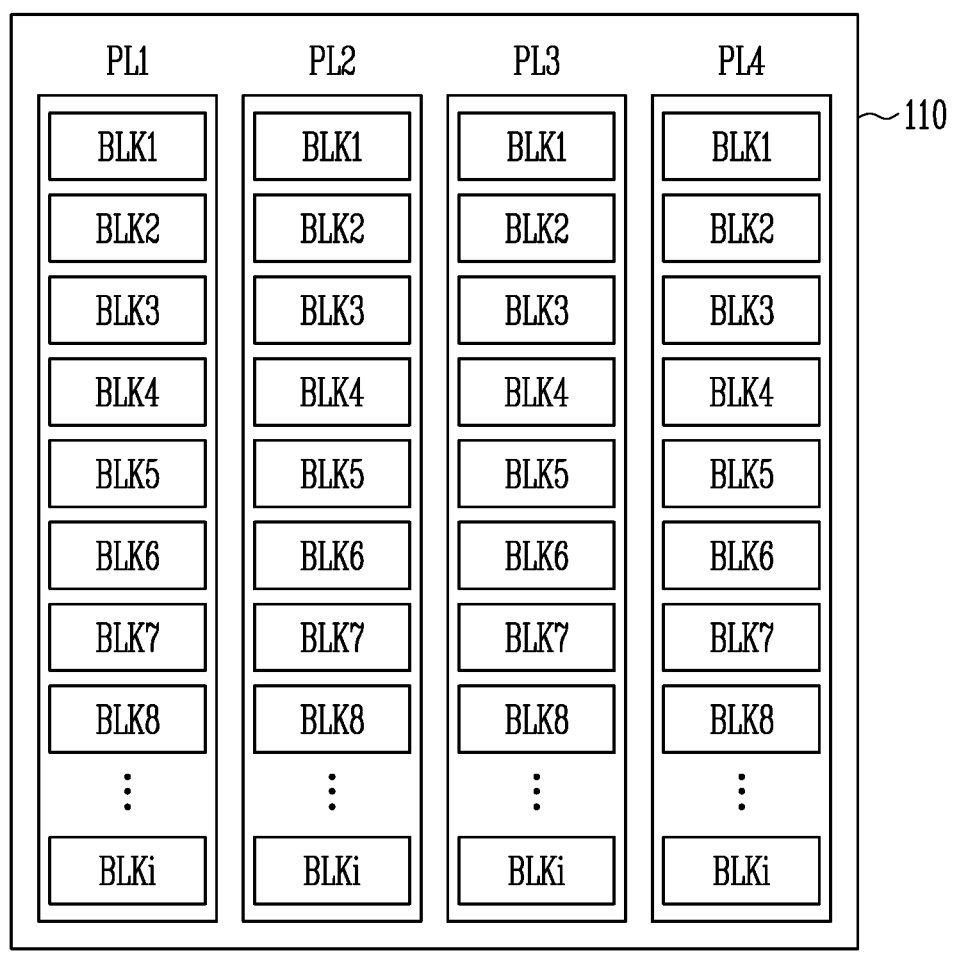
FIG. 2 is a diagram illustrating a memory cell array.

FIG. 2 is a diagram illustrating the memory cell array.

Referring to FIG. 2, the memory cell array 110 may include a plurality of planes PL1 to PL4. Respective page buffer groups 140 of FIG. 1 may be connected to the planes PL1 to PL4. Each of the planes PL1 to PL4 may include a plurality of memory blocks BLK1 to BLKi (where i is a positive integer of 2 or greater). Different row addresses may be set in the plurality of memory blocks BLK1 to BLKi. The program operation may be performed in a memory block selected according to the row address RADD output from the logic circuit 180 of FIG. 1. Different local lines including word lines may be connected to the plurality of memory blocks BLK1 to BLKi, and the bit lines may be commonly connected to the plurality of memory blocks BLK1 to BLKi.

The individual current sensing mode may be performed during a program operation of a selected page in each selected memory block of the planes PL1 to PL4, and the individual current sensing operation may pass when all of the selected memory cells of the selected pages in the planes PL1 to PL4 are programmed to the selected or target program state. In the entire current sensing mode, when at least one page on which the program operation is completed is detected among the planes PL1 to PL4, the entire current sensing operation may be determined to have passed even though there is a plane on which the program operation has not completed in the memory cell array 110.

One of the plurality of memory blocks BLK1 to BLKi shown in FIG. 2 is specifically described as follows.

Figure 3:
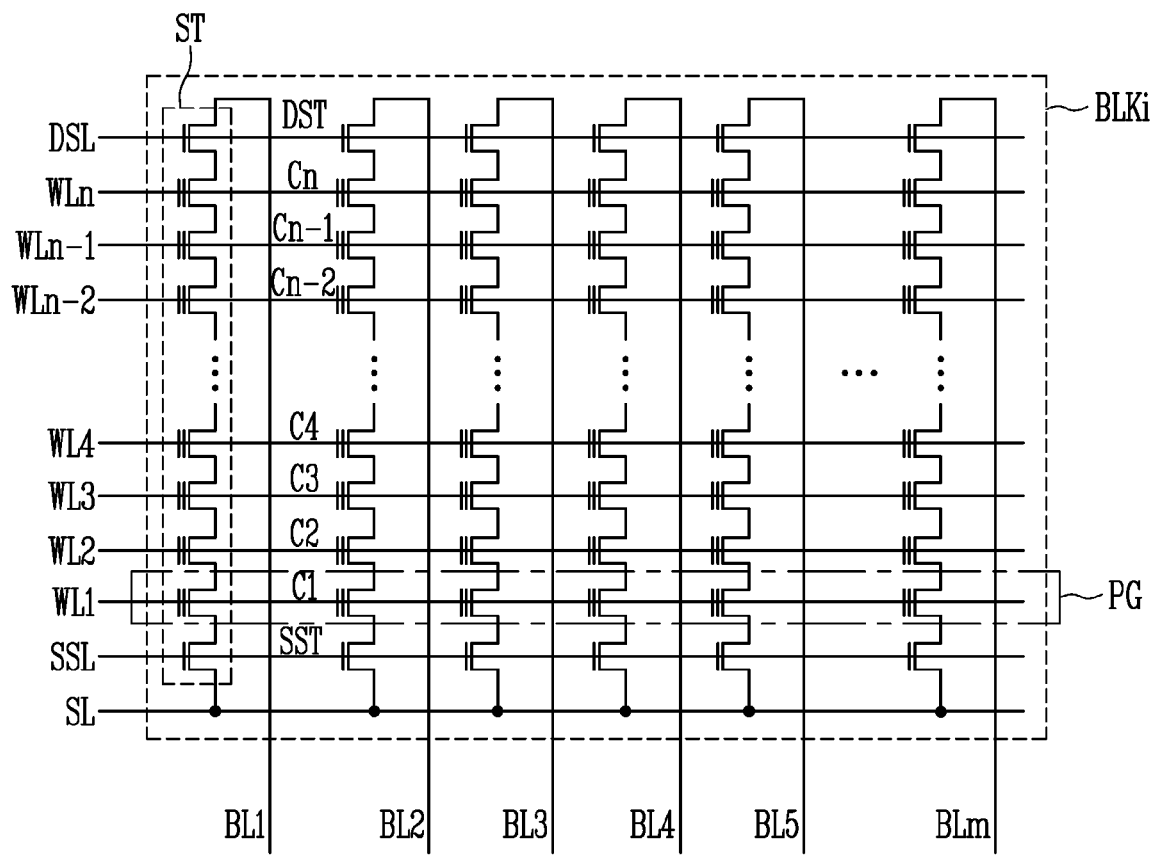
FIG. 3 is a diagram illustrating a memory block.

FIG. 3 is a diagram illustrating the memory block.

Referring to FIG. 3, any one memory block BLKi among the plurality of memory blocks BLK1 to BLKi shown in FIG. 2 is shown as an embodiment.

The memory block BLKi may include a plurality of strings ST connected between first to m-th bit lines BL1 to BLm (where m is a positive integer of 2 or greater) and a source line SL. Each of the strings ST may include a source select transistor SST, first to n-th memory cells C1 to Cn, and a drain select transistor DST connected in series between the source line SL and the first to m-th bit lines BL1 to BLm.

FIG. 3 illustrates an exemplary configuration of the memory block. Accordingly, the number of source select transistors SST, first to n-th memory cells C1 to Cn, and drain select transistors DST is not limited to the number shown in FIG. 3.

Gates of the source select transistors SST connected to different strings ST may be connected to a source select line SSL, gates of each of the first to n-th memory cells C1 to Cn may be connected to first to n-th word lines WL1 to WLn, and gates of the drain select transistors DST may be connected to a drain select line DSL.

A group of memory cells connected to the same word line and included in different strings ST may configure one page PG. The program operation may be performed in a unit of the page PG. For example, a sub program operation and the verify operation may be performed in the unit of the page PG. For example, after the sub program operation of the selected page is performed, the verify operation of the selected page may be performed.

Figure 4:
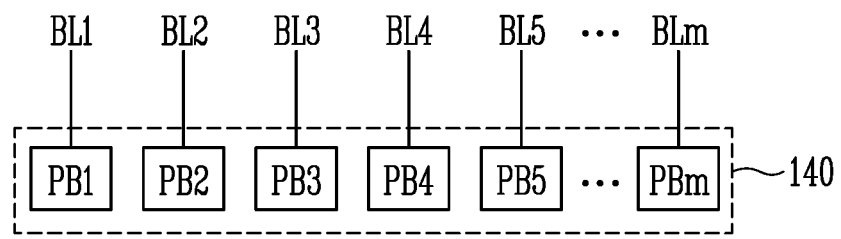
FIG. 4 is a diagram illustrating a page buffer group.

FIG. 4 is a diagram illustrating a page buffer group 140.

Referring to FIG. 4, the page buffer group 140 may include first to m-th page buffers PB1 to PBm (where m is a positive integer of 2 or greater). The first to m-th page buffers PB1 to PBm may be connected to the first to m-th bit lines BL1 to BLm, respectively. Each of the first to m-th page buffers PB1 to PBm may include a plurality of latches, and may sense a current or a voltage of the first to m-th bit lines BL1 to BLm, which is changed according to a threshold voltage of the memory cells, and store sensing data in a selected latch, during the verify operation.

Figure 5:
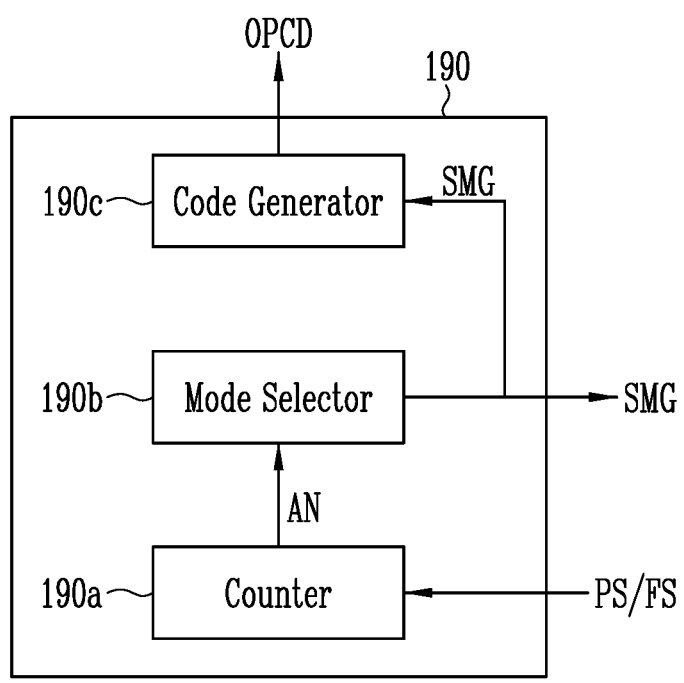
FIG. 5 is a diagram illustrating a sensing mode selector according to an embodiment of the present disclosure.

FIG. 5 is a diagram illustrating a sensing mode selector 190 according to an embodiment of the present disclosure.

Referring to FIG. 5, the sensing mode selector 190 may include a counter 190a, a mode selector 190b, and a code generator 190c.

The counter 190a may count the number of program loops in response to the pass signal PS or the fail signal FS, as well as manage the counted or accumulated number of program loops AN. For example, the counter 190a may increase the accumulated number of program loops AN by 1 in response to the fail signal FS and output the accumulated number AN. In addition, the counter 190a may initialize the count of the number of loops to 0 when the pass signal PS is input.

The mode selector 190b may compare the accumulated number AN output from the counter 190a with a reference number and output the sensing mode signal SMG according to a comparison result. The sensing mode signal SMG output may correspond to a mode selected from among the individual current sensing mode, the entire current sensing mode, and the mixed current sensing mode. For example, the mode selector 190b may output the sensing mode signal SMG corresponding to the individual current sensing mode when the accumulated number AN is less than the reference number. The mode selector 190 may output the sensing mode signal SMG corresponding to the mixed current sensing mode when AN is equal to or greater than the reference number. That is, after a main program operation starts, the individual current sensing operation may be performed when AN is less than the reference number, and the individual current sensing operation and the entire current sensing operation may be sequentially performed when AN is equal to or greater than the reference number.

Figure 10:
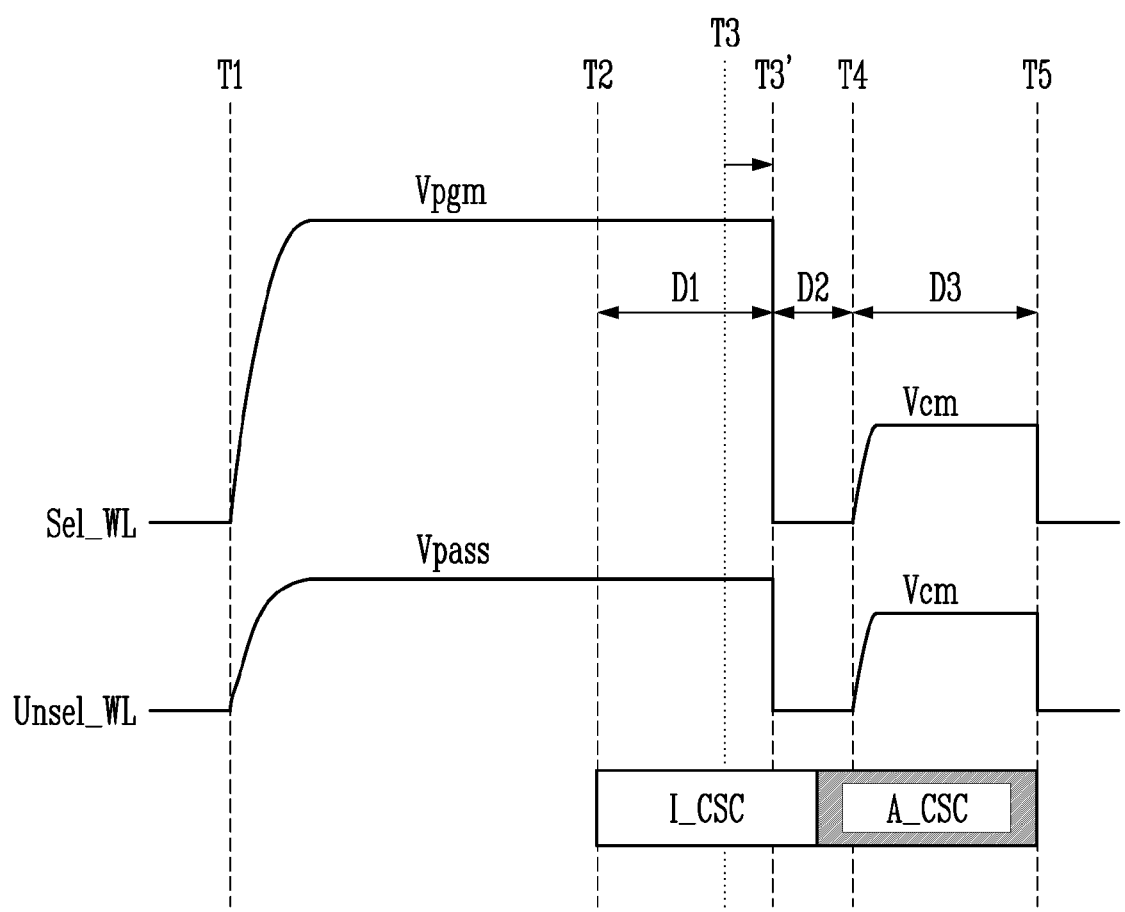
FIG. 10 is a timing diagram illustrating the mixed current sensing mode according to a first embodiment of the present disclosure.

The code generator 190c may change and output the operation code OPCD in response to the sensing mode signal SMG output from the mode selector 190b. For example, when the sensing mode signal SMG corresponding to the individual current sensing mode is received, the code generator 190c may set a first time interval (e.g., T3 to T4 in FIG. 8) for discharging the selected word line between a sub program operation and a verify operation. Alternatively, when the sensing mode signal SMG corresponding to the mixed current sensing mode is received, the code generator 190c may set a second time interval shorter than the first time interval (e.g., T3' to T4 as illustrated in FIG. 10) for discharging the selected word line between the sub program operation and the verify operation. The code generator 190c may output the operation code to reflect the set time interval.

Figure 6:
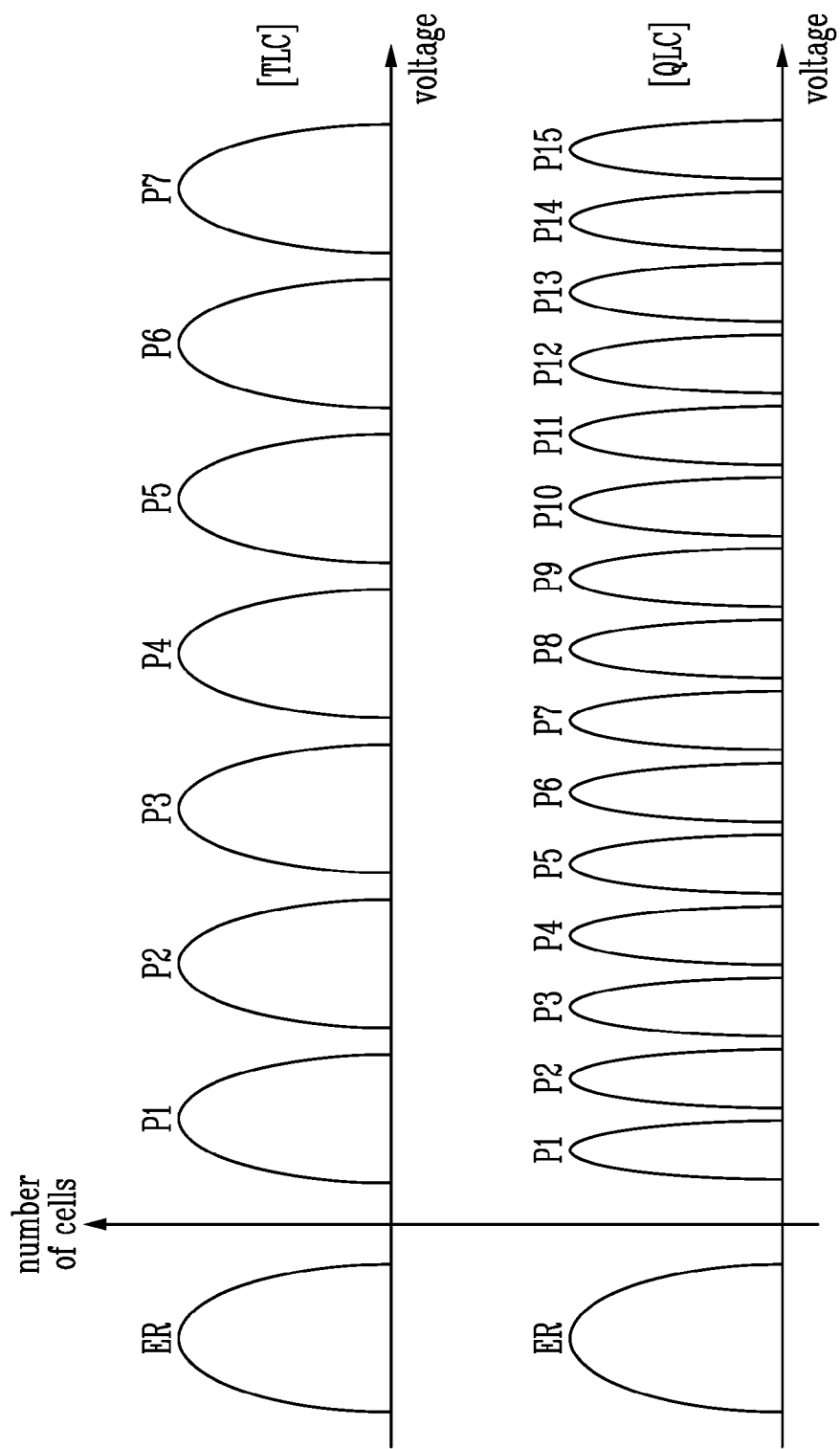
FIG. 6 is a diagram illustrating a threshold voltage distribution of memory cells.

FIG. 6 is a diagram illustrating a threshold voltage distribution of the memory cells.

Referring to FIG. 6, the program operation may be any of various methods according to the number of bits stored in the memory cell. For example, a method in which 3 bits of data are stored in one memory cell is referred to as a triple level cell (TLC) method, and a method in which 4 bits of data are stored in one memory cell is referred to as a quadruple level cell (QLC) method.

In the TLC method, a state of the memory cells may be an erase state ER or any of seven program states P1 to P7. In the QLC method, the state of the memory cells may be an erase state ER or any of fifteen program states P1 to P15.

In other embodiments, the number of bits that may be stored in one memory cell may be 5 or more, in which case other suitable programming methods may be used. The invention is not limited to any particular number of bits that may be stored in the memory cell.

The verify operations using various verify voltages may be performed to program the memory cells to different program states. An entire program operation of the selected page may be defined as a main program operation that includes a plurality of program loops, and each of the program loops may include a sub program operation and a verify operation. The program loops are specifically described as follows.

Figure 7:
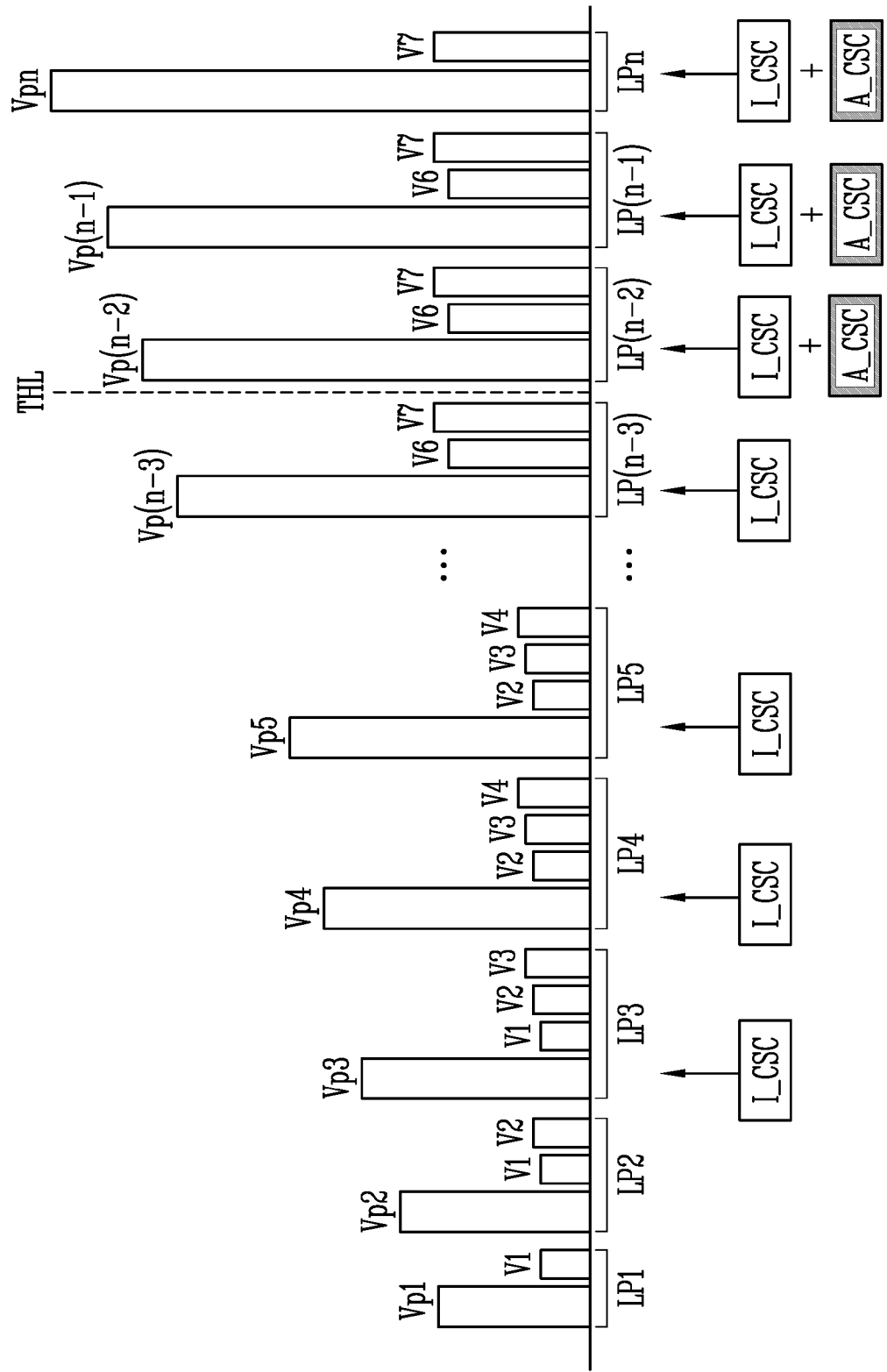
FIG. 7 is a diagram illustrating a main program operation.

FIG. 7 is a diagram illustrating the main program operation.

Referring to FIG. 7, the main program operation may include first to n-th program loops LP1 to LPn. For example, when the main program operation of the selected page is started, the first program loop LP1 to the n-th program loop LPn may be sequentially performed. The variable n representing the number of loops performed may be a positive integer of 2 or greater and may vary according to a result of the verify operation performed in each program loop. Here, a maximum value of n is set in advance, and the selected memory block may be treated as a bad block when the verify operation fails in each of the n program loops.

Each of the first to n-th program loops LP1 to LPn may include a sub program operation and the verify operation. In a sub program operation a program pulse is applied to the selected word line, and the verify operation determines whether the threshold voltage of the memory cells is increased to a target voltage.

FIG. 7 illustrates the main program operation of the TLC method as an embodiment. In the main program operation of the TLC method, the memory cells may be programmed to seven program states. Therefore, at least seven verify voltages may be used in the verify operation. For example, in the sub program operation of the first program loop LP1, a first program pulse Vp1 may be applied to the selected word line. The first program pulse Vp1 may be a start program pulse of the main program operation. The first program pulse Vp1 may be a positive voltage higher than 0V, and the threshold voltage of the selected memory cells may be increased by the first program pulse Vp1. In the sub program operation, the selected memory cells may be connected to bit lines to which a program permission voltage is applied, and unselected memory cells may be connected to bit lines to which a program inhibition voltage is applied. The program permission voltage may be 0V, and the program inhibition voltage may be a power supply voltage. In the verify operation of the first program loop LP1, a first verify voltage V1 may be applied to the selected word line. The first verify voltage V1 may be a positive voltage higher than 0V used to determine whether the selected memory cells are programmed to a first program state. When the verify operation of the first program loop LP1 failed, the second program loop LP2 may be performed.

In the second program loop LP2, the sub program operation may be performed using a second program pulse Vp2 of which a voltage is higher than that of the first program pulse Vp1, and the verify operations on first and second program states may be successively performed. For example, in the verify operation of the second program loop LP2, the verify operation on the first program state and the verify operation on the second program state may be sequentially performed. The first verify voltage V1 may be used in the verify operation on the first program state, and a second verify voltage V2 higher than the first verify voltage V1 may be used in the verify operation on the second program state.

In the third program loop LP3, the sub program operation may be performed using a third program pulse Vp3 of which a voltage is higher than that of the second program pulse Vp2, and the verify operations on first to third program states may be successively performed. The first verify voltage V1 may be used in the verify operation on the first program state, the second verify voltage V2 higher than the first verify voltage V1 may be used in the verify operation on the second program state, and a third verify voltage V3 higher than the second verify voltage V2 may be used in the verify operation on the third program state. In FIG. 7, the individual current sensing operation I_CSC is performed starting from the third program loop LP3, but the loop in which the individual current sensing operation is started may be set differently according to the program operation. As shown in FIG. 7, when there is a low probability that the verify operation on the first program state in the first and second program loops LP1 and LP2 will pass, the individual current sensing operation I_CSC may be performed starting from the third program loop LP3. The individual current sensing operation I_CSC may be sequentially performed from a low pass probability program state. Therefore, when the individual current sensing operation I_CSC is first performed in the third program loop LP3, the individual current sensing operation may be performed to determine whether the first program state passed or failed. When the individual current sensing operation I_CSC performed on the first program state in the third program loop LP3 passed, the verify operation using the first verify voltage V1 is not performed in the fourth program loop LP4.

In the fourth program loop LP4, the sub program operation may be performed using a fourth program pulse Vp4 of which a voltage is higher than that of the third program pulse Vp3, and the verify operations on second to fourth program states may be successively performed. In the verify operation on the fourth program state, a fourth verify voltage V4 higher than the third verify voltage V3 may be used. The individual current sensing operation I_CSC performed in the fourth program loop LP4 may be performed on the second program state as exemplified in FIG. 7. When the individual current sensing operation I_CSC performed in the fourth program loop LP4 failed, the individual current sensing operation I_CSC on the second program state may also be performed in the fifth program loop LP5.

The entire current sensing operation A_CSC may be additionally performed after the accumulated number of program loops AN reaches a threshold number THL. For example, assuming that the threshold number THL is set to (n-3), the entire current sensing operation A_CSC may be performed from an (n-2)-th program loop LP(n-2) until the program operation of the selected page ends. For example, in the (n-2)-th program loop LP(n-2), the entire current sensing operation A_CSC may be performed after the individual current sensing operation I_CSC is performed.

The entire current sensing operation A_CSC in each of the (n-2)-th to n-th program loops LP(n-2) to LPn may be performed in all planes included in the memory cell array. The main program operation may be ended when the entire current sensing operation A_CSC performed in at least one plane is passed.

The memory cells included in the selected page may be programmed to the first to seventh program states according to the above-described method. The main program operation may vary according to physical and electrical characteristics of the memory cells.

The sub program operation when the individual current sensing operation I_CSC and the entire current sensing operation A_CSC are performed is described as follows.

Figure 8:
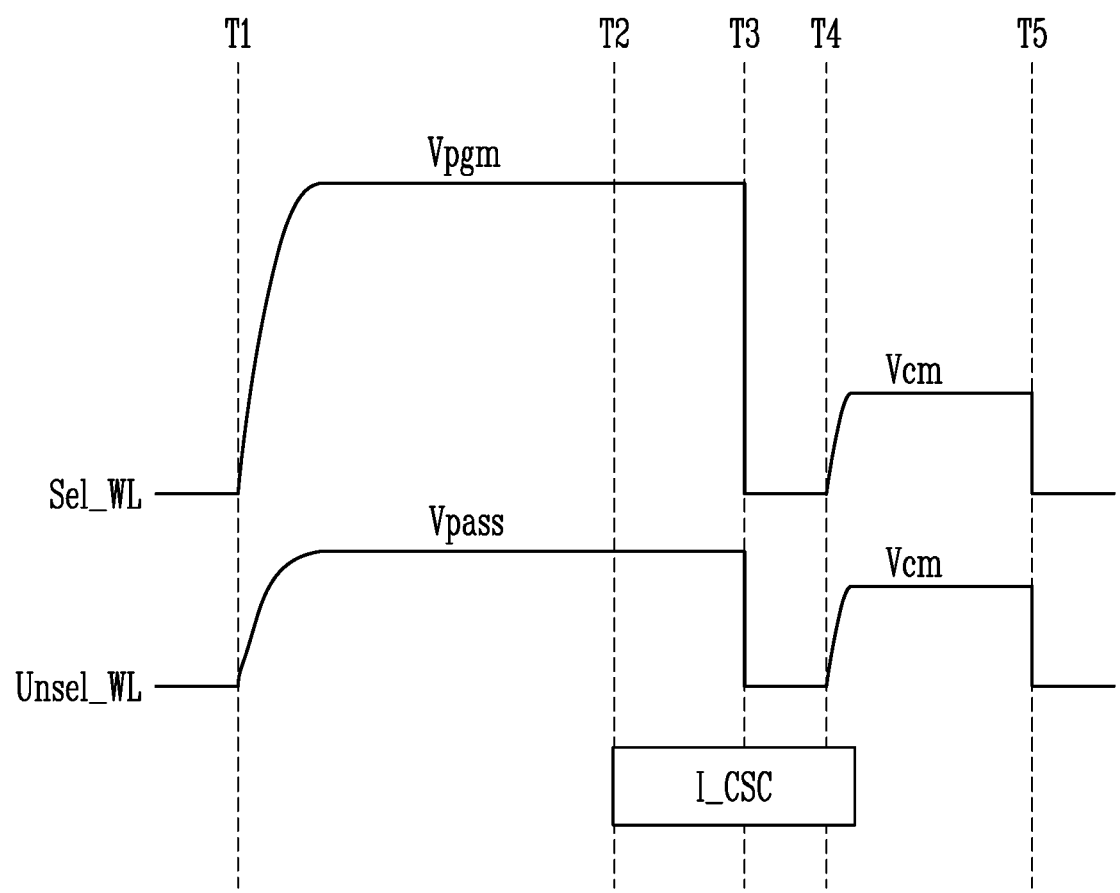
FIG. 8 is a diagram illustrating an individual current sensing mode according to an embodiment of the present disclosure.

FIG. 8 is a diagram illustrating the individual current sensing mode according to an embodiment of the present disclosure.

Referring to FIG. 8, in the individual current sensing mode, the individual current sensing operation may be performed among the individual current sensing operation and the entire current sensing operation. The individual current sensing mode is specifically described as follows.

When the sub program operation starts (T1), the program voltage Vpgm may be applied to the selected word line Sel_WL, and the pass voltage Vpass may be applied to the unselected word lines Unsel_WL. The program voltage Vpgm may be for increasing the threshold voltage of the selected memory cells, and the pass voltage Vpass may be for turning on the unselected memory cells.

The individual current sensing operation I_CSC may be performed at a time point T2. The individual current sensing operation I_CSC may be performed by the current sensing circuit 170 of FIG. 1, and since sensing takes time, the sub program operation may be continuously performed while the individual current sensing operation I_CSC is performed.

When the program voltage Vpgm is applied to the selected word line Sel_WL for a sufficient time (T1 to T3), the selected word line Sel_WL and the unselected word lines Unsel_WL may be discharged. A discharge operation of the word lines Sel_WL and Unsel_WL may be performed in a period T3 to T4.

At a time point T4, a compensation operation for matching potentials of the word lines Sel_WL and Unsel_WL to be equal may be performed for the verify operation after the sub program operation. For example, a difference may occur in voltages applied to the selected word line Sel_WL and the unselected word lines Unsel_WL before T3. In this case, when the discharge operation is performed at the time point T3, coupling between the word lines Sel_WL and Unsel_WL may occur, and thus a potential difference between the word lines Sel_WL and Unsel_WL may occur. Therefore, the compensation operation for reducing the potential difference between the word lines Sel_WL and Unsel_WL may be performed in a period T4 to T5. During the compensation operation, a compensation voltage Vcm may be applied to the word lines Sel_WL and Unsel_WL. After completion of the compensation operation, the word lines Sel_WL and Unsel_WL may be discharged. For example, the compensation voltage Vcm may be set to a voltage higher than 0V and lower than the pass voltage Vpass.

In the individual current sensing mode, since the individual current sensing operation I_CSC may end before the sub program operation ends at time T5, for the time it takes to perform the main program operation does not increase even with the individual current sensing operation I_CSC.

Figure 9:
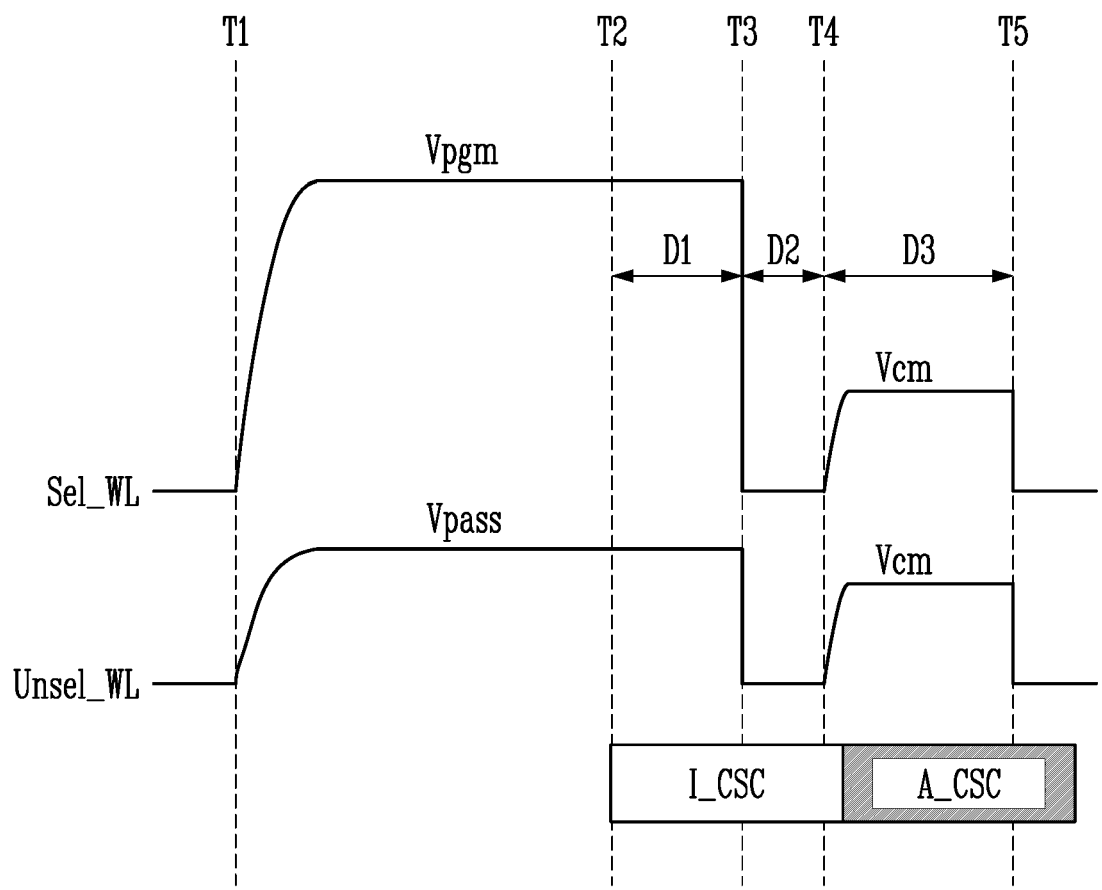
FIG. 9 is a diagram illustrating a mixed current sensing mode.

FIG. 9 is a diagram illustrating the mixed current sensing mode.

Referring to FIG. 9, in the mixed current sensing mode, the individual current sensing operation I_CSC and the entire current sensing operation A_CSC may be sequentially performed. For example, the entire current sensing operation A_CSC may be performed after the individual current sensing operation I_CSC ends. In the entire current sensing operation A_CSC, since it is determined whether the program operation on the selected pages in the plurality of planes is completed, a certain time may be required. Since a next operation may be performed only when the entire current sensing operation A_CSC has ended, when the entire current sensing operation A_CSC ends after an end time (i.e., time T5 in FIG. 9) of a corresponding sub program operation, a time required for the main program operation may increase by an amount of time between completion of the corresponding sub program operation and the entire current sensing operation A_CSC.

Accordingly, in an embodiment, an increase of the time required for the main program operation may be prevented by adjusting at least one of a first period D1, between T2 at which the individual current sensing operation I_CSC is started and T3 at which discharge of the word lines Sel_WL and Unsel_WL starts, a second period D2 between T3 to T4 at which the discharge of the word lines Sel_WL and Unsel_WL is completed, a third period D3 between T4 to T5 during which the compensation operation is being performed.

FIG. 10 is a timing diagram illustrating the mixed current sensing mode according to a first embodiment of the present disclosure.

Referring to FIG. 10, in the first embodiment, the first period D1 may be adjusted. For example, the time point T3 at which discharge of the word lines Sel_WL and Unsel_WL starts may be adjusted. When the time point T3 is delayed, i.e., changed to a time point T3', since the first period D1 increases, the time points T4 and T5 are also delayed commensurate with the increase in the first period D1. That is, the first period D1 increases, but the second and third periods D2 and D3 may be maintained. The delay from T3 to T3' may be set to an amount of time between T5 and a time at which the entire current sensing operation A_CSC ends.

Figure 11:
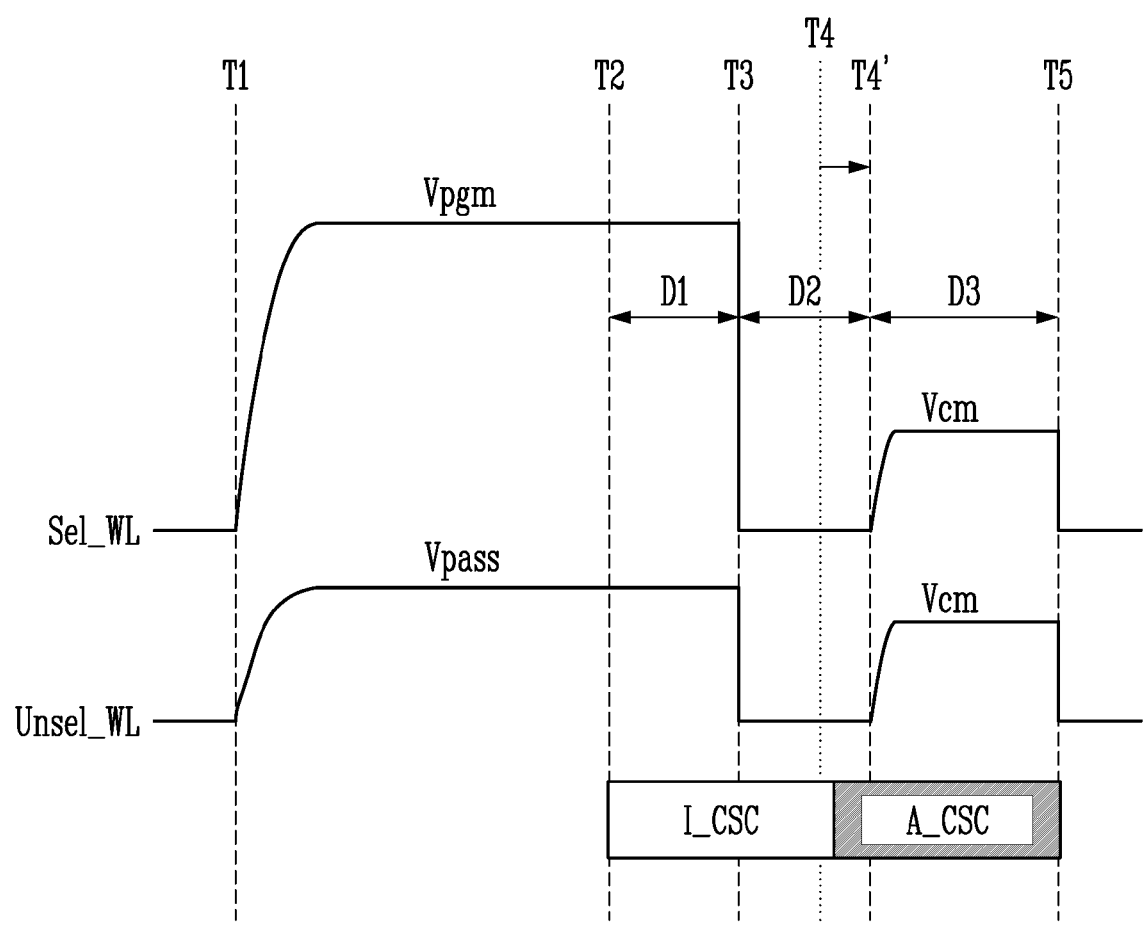
FIG. 11 is a timing diagram illustrating the mixed current sensing mode according to a second embodiment of the present disclosure.

FIG. 11 is a timing diagram illustrating the mixed current sensing mode according to a second embodiment of the present disclosure.

Referring to FIG. 11, in the second embodiment, the second period D2 may be adjusted. For example, the time point T4 at which the discharge of the word lines Sel_WL and Unsel_WL is completed may be adjusted. When the time point T4 is changed, i.e., delayed, to a time point T4', since the second period D2 increases, the time point T5 is also delayed commensurate with the increase of the second period D2. That is, the second period D2 increases, but the first and third periods D1 and D3 may be maintained. An amount of time delayed from T4 to T4' may be set to an amount of time between T5 and a time at which the entire current sensing operation A_CSC ends.

Figure 12:
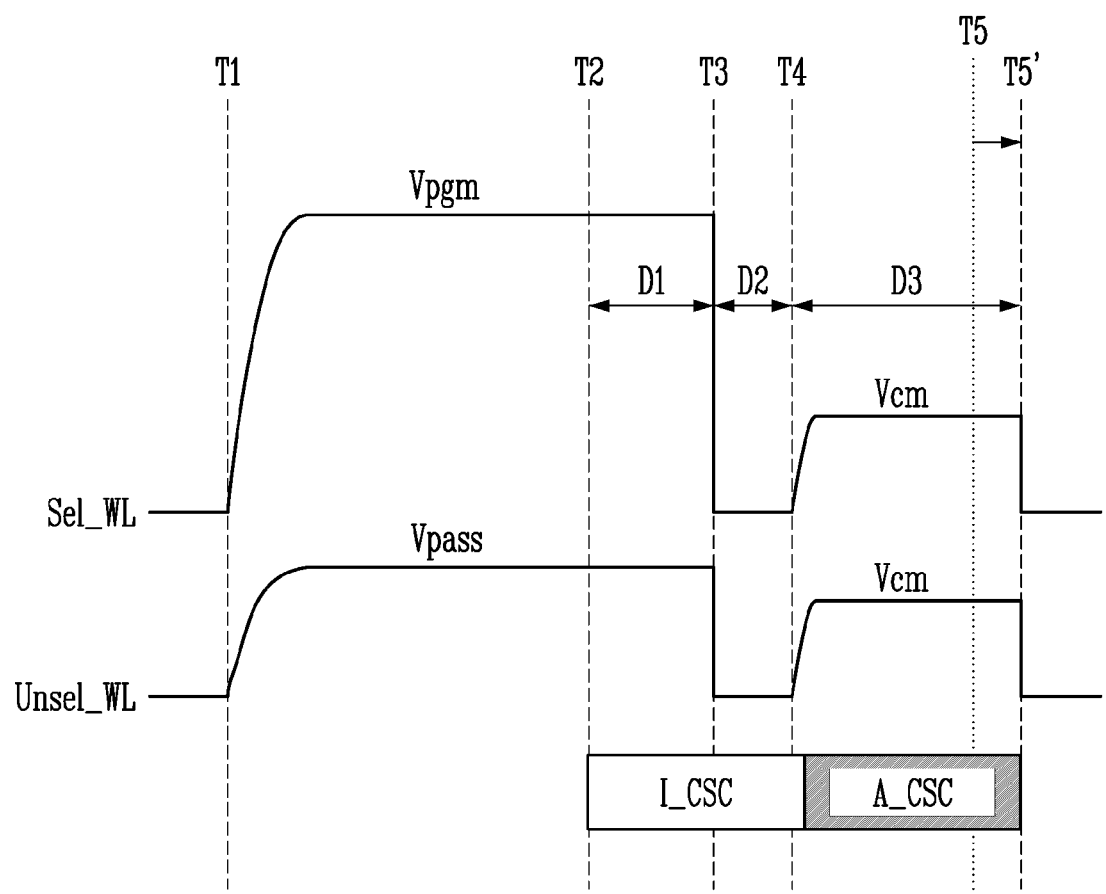
FIG. 12 is a diagram illustrating the mixed current sensing mode according to a third embodiment of the present disclosure.

FIG. 12 is a diagram illustrating the mixed current sensing mode according to a third embodiment of the present disclosure.

Referring to FIG. 12, in the third embodiment, the third period D3 may be adjusted. For example, the time point T5 at which the compensation operation is completed may be adjusted. When the time point T5 is changed, i.e., delayed, to a time point T5', the third period D3 increases. The delay from T5 to T5' may be set such that T5' is when the entire current sensing operation A_CSC ends.

As described above, when performing the individual current sensing operation I_CSC and the entire current sensing operation A_CSC, the time required for the main program operation may be reduced by adjusting the time duration for applying a voltage to the word lines Sel_WL and Unsel_WL or discharging the word lines Sel_WL and Unsel_WL. The first to third embodiments described above may be individually applied to the main program operation, all of the first to third embodiments may be applied, or some embodiments may be selectively applied.

Figure 13:
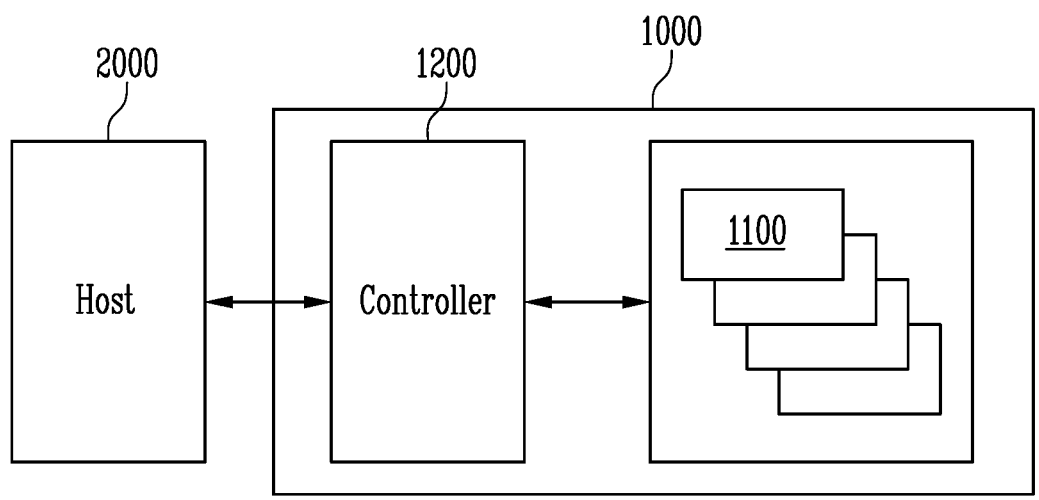
FIG. 13 is a diagram illustrating a memory system including the memory device of the present disclosure.

FIG. 13 is a diagram illustrating a memory system 1000 including the memory device of the present disclosure.

Referring to FIG. 13, the memory system 1000 may include the memory device 1100 in which data is stored and the controller 1200 communicating between the memory device 1100 and a host 2000.

The memory system 1000 may include a plurality of memory devices 1100, each of which may be connected to the controller 1200 through at least one channel. For example, each of the plurality of memory devices 1100 may be connected to the controller 1200 via its own channel, all of the memory devices 1100 may be connected to the controller 1200 via the same channel, or the memory devices 1100 may be divided into groups with each group having its own channel, such that all memory devices in a given group are connected to the controller 1200 via the same channel.

The controller 1200 may communicate between the host 2000 and the memory device 1100. The controller 1200 may control the memory device 1100 according to a request from the host 2000 or may perform a background operation for performance improvement of the memory system 1000 without a request from the host 2000. The host 2000 may generate requests for various operations and may output the generated requests to the memory system 1000. For example, the requests may include a program request that may control the program operation, a read request that may control the read operation, an erase request that may control the erase operation, and the like.

The host 2000 may communicate with the memory system 1000 through any of various interfaces such as peripheral component interconnect express (PCIe), advanced technology attachment (ATA), serial ATA (SATA), parallel ATA (PATA), serial attached SCSI (SAS), non-volatile memory express (NVMe) a universal serial bus (USB), a multi-media card (MMC), an enhanced small disk interface (ESDI), or integrated drive electronics (IDE).

Figure 14:
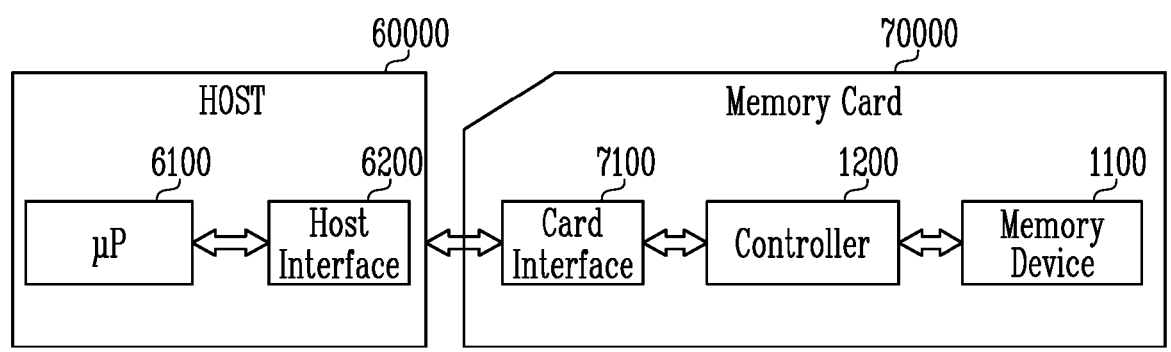
FIG. 14 is a diagram illustrating a memory system including the memory device according to another embodiment of the present disclosure.

FIG. 14 is a diagram illustrating another memory system 7000 including the memory device of the present disclosure.

Referring to FIG. 14, the memory system 70000 may be implemented as a memory card or a smart card. The memory system 70000 may include the semiconductor memory device 1100, the controller 1200, and a card interface 7100.

The controller 2100 may control data exchange between the memory device 1100 and the card interface 7100. According to an embodiment, the card interface 7100 may be a secure digital (SD) card interface or a multi-media card (MMC) interface, but the invention is not limited thereto.

The card interface 7100 may interface data exchange between a host 60000 and the controller 1200 according to a protocol of the host 60000. According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the controller 1200 under control of a microprocessor (μP) 6100.

While the present invention has been illustrated and described in connection with various embodiments, those skilled in the art will recognize in light of the present disclosure that various modifications may be made to any of the disclosed embodiments within the spirit and scope of the invention. The present invention encompasses all such modifications that fall within the scope of the claims.

What is claimed is:

1. A memory device comprising:
a plurality of memory cells;
page buffers configured to store sensing data sensed from the memory cells;
a current sensing circuit configured to perform an individual current sensing operation of outputting a pass signal or a fail signal according to a verify result of each of selected program states in an individual current sensing mode and perform an entire current sensing operation of outputting the pass signal or the fail signal according to a verify result of the entire memory cells regardless of the selected program states after the individual current sensing operation is performed in a mixed current sensing mode, in response to a sensing mode signal;
a sensing mode selector configured to output the sensing mode signal corresponding to the individual current sensing mode or the mixed current sensing mode in response to the pass signal or the fail signal, and output an operation code according to the sensing mode signal; and
a voltage generator configured to apply a program voltage to a selected word line connected to the memory cells during a first amount of time in the individual current sensing mode and apply the program voltage to the selected word line during a second amount of time greater than the first amount of time in the mixed current sensing mode, in response to the operation code.

2. The memory device of claim 1, wherein the sensing mode selector comprises:
a counter configured to count the number of program loops in response to the pass signal or the fail signal and output an accumulated number;
a mode selector configured to compare the accumulated number with a reference number, and output the sensing mode signal corresponding to the individual current sensing mode or the mixed current sensing mode according to a comparison result; and
a code generator configured to output the operation code to the voltage generator in response to the sensing mode signal so that the program voltage is applied to the selected word line during the first amount of time or the second amount of time.

3. The memory device of claim 2, wherein the counter increases the accumulated number whenever the fail signal is input, outputs the accumulated number, and initializes the accumulated number when the pass signal is input.

4. The memory device of claim 2, wherein the mode selector outputs the sensing mode signal as a signal corresponding to the individual current sensing mode when the accumulated number is less than the reference number, and outputs the sensing mode signal as a signal corresponding to the mixed current sensing mode when the accumulated number is equal to or greater than the reference number.

5. The memory device of claim 2, wherein the code generator outputs the operation code so that the program voltage is applied to the selected word line during the first duration of time when the sensing mode signal is a signal corresponding to the individual current sensing mode, and outputs the operation code so that the program voltage is applied to the selected word line during the second duration of time when the sensing mode signal is a signal corresponding to the mixed current sensing mode.

6. The memory device of claim 1, wherein the current sensing circuit performs the individual current sensing operation or the entire current sensing operation by comparing a set number with a number of fail bits detected in a verify operation of a previous program loop.

7. The memory device of claim 6, wherein the set number used in the individual current sensing operation is different from the set number used in the entire current sensing operation.

8. The memory device of claim 1, wherein the voltage generator is configured to discharge the selected word line during a set time and apply a compensation voltage to the selected word line after applying the program voltage to the selected word line during the first or second duration of time.

9. The memory device of claim 1, wherein a difference between the second duration of time and the first duration of time is set to a time difference between a time at which a sub program operation is ended in the individual current sensing mode and a time at which the entire current sensing operation is ended in the mixed current sensing mode.

10. A memory device comprising:
a plurality of memory cells;
page buffers configured to store sensing data sensed from the memory cells;
a current sensing circuit configured to perform an individual current sensing operation of outputting a pass signal or a fail signal according to a verify result of each of selected program states in an individual current sensing mode and perform an entire current sensing operation of outputting the pass signal or the fail signal according to a verify result of the entire memory cells regardless of the selected program states after the individual current sensing operation is performed in a mixed current sensing mode, in response to a sensing mode signal;
a sensing mode selector configured to output the sensing mode signal corresponding to the individual current sensing mode or the mixed current sensing mode in response to the pass signal or the fail signal, and output an operation code according to the sensing mode signal; and
a voltage generator configured to discharge a selected word line during a first duration of time in the individual current sensing mode and discharge the selected word line during a second duration of time greater than the first duration of time in the mixed current sensing mode, in response to the operation code, after applying a program voltage to the selected word line connected to the memory cells, during a program operation.

11. The memory device of claim 10, wherein the sensing mode selector comprises:
   a counter configured to count the number of program loops in response to the pass signal or the fail signal and output an accumulated number;
   a mode selector configured to compare the accumulated number with a reference number, and output the sensing mode signal corresponding to the individual current sensing mode or the mixed current sensing mode according to a comparison result; and
   a code generator configured to output the operation code to the voltage generator in response to the sensing mode signal for the voltage generator to discharge the selected word line during the first duration of time or the second duration of time.

12. The memory device of claim 11, wherein the counter increases the accumulated number whenever the fail signal is input, outputs the accumulation number, and initializes the accumulated number when the pass signal is input.

13. The memory device of claim 11, wherein the mode selector outputs the sensing mode signal as a signal corresponding to the individual current sensing mode when the accumulated number is less than the reference number, and outputs the sensing mode signal as a signal corresponding to the mixed current sensing mode when the accumulated number is equal to or greater than the reference number.

14. The memory device of claim 11, wherein the code generator outputs the operation code for the voltage generator to discharge the selected word line during the first duration of time when the sensing mode signal is a signal corresponding to the individual current sensing mode, and outputs the operation code for the voltage generator to discharge the selected word line during the second duration of time when the sensing mode signal is a signal corresponding to the mixed current sensing mode.

15. The memory device of claim 10, wherein the current sensing circuit performs the individual current sensing operation or the entire current sensing operation by comparing a set number with a number of fail bits detected in a verify operation of a previous program loop.

16. The memory device of claim 15, wherein the set number used in the individual current sensing operation is different from the set number used in the entire current sensing operation.

17. The memory device of claim 10, wherein the voltage generator is configured to discharge the selected word line during the first or second duration of time and then apply a compensation voltage to the selected word line.

18. A memory device comprising:
   a plurality of memory cells;
   page buffers configured to store sensing data sensed from the memory cells;
   a current sensing circuit configured to perform an individual current sensing operation of outputting a pass signal or a fail signal according to a verify result of each of selected program states in an individual current sensing mode and perform an entire current sensing operation of outputting the pass signal or the fail signal according to a verify result of the entire memory cells regardless of the selected program states after the individual current sensing operation is performed in a mixed current sensing mode, in response to a sensing mode signal;
   a sensing mode selector configured to output the sensing mode signal corresponding to the individual current sensing mode or the mixed current sensing mode in response to the pass signal or the fail signal, and output an operation code according to the sensing mode signal; and
   a voltage generator configured to apply a compensation voltage to a discharged selected word line during a first duration of time in the individual current sensing mode and apply the compensation voltage to the discharged selected word line during a second duration of time greater than the first duration of time in the mixed current sensing mode, in response to the operation code, after applying a program voltage to the selected word line connected to the memory cells and discharging the selected word line, during a program operation.

19. The memory device of claim 18, wherein the sensing mode selector comprises:
   a counter configured to count an accumulation number of program loops in response to the pass signal or the fail signal and output the accumulation number;
   a mode selector configured to compare the accumulation number and a reference number with each other, and output the sensing mode signal corresponding to the individual current sensing mode or the mixed current sensing mode according to a comparison result; and
   a code generator configured to output the operation code to the voltage generator in response to the sensing mode signal for the voltage generator to apply the compensation voltage to the selected word line during the first duration of time or the second duration of time.

20. The memory device of claim 19, wherein the code generator outputs the operation code for the voltage generator to apply the compensation voltage during the first duration of time when the sensing mode signal is a signal corresponding to the individual current sensing mode, and outputs the operation code for the voltage generator to apply the compensation voltage during the second duration of time when the sensing mode signal is a signal corresponding to the mixed current sensing mode.

* * * * *